United States Patent
Pai et al.

(10) Patent No.: US 10,141,266 B2
(45) Date of Patent: Nov. 27, 2018

(54) METHOD OF FABRICATING SEMICONDUCTOR PACKAGE STRUCTURE

(71) Applicant: Siliconware Precision Industries Co., Ltd., Taichung (TW)

(72) Inventors: Yu-Cheng Pai, Taichung (TW);
Wei-Chung Hsiao, Taichung (TW);
Shih-Chao Chiu, Taichung (TW);
Chun-Hsien Lin, Taichung (TW);
Ming-Chen Sun, Taichung (TW);
Tzu-Chieh Shen, Taichung (TW);
Chia-Cheng Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 66 days.

(21) Appl. No.: 15/621,337

(22) Filed: Jun. 13, 2017

(65) Prior Publication Data
US 2017/0287840 A1    Oct. 5, 2017

Related U.S. Application Data

(62) Division of application No. 14/708,249, filed on May 10, 2015, now Pat. No. 10,043,757.

(30) Foreign Application Priority Data

Sep. 17, 2014  (TW) .............................. 103132037 A

(51) Int. Cl.
*H01L 23/48*   (2006.01)
*H01L 23/538*  (2006.01)
*H01L 23/00*   (2006.01)
*H01L 21/56*   (2006.01)
*H01L 23/31*   (2006.01)

(52) U.S. Cl.
CPC .......... *H01L 23/5389* (2013.01); *H01L 24/19* (2013.01); *H01L 24/96* (2013.01); *H01L 21/568* (2013.01); *H01L 23/3128* (2013.01); *H01L 2224/04105* (2013.01); *H01L 2224/16227* (2013.01); *H01L 2224/97* (2013.01); *H01L 2924/15311* (2013.01)

(58) Field of Classification Search
CPC ........ H01L 21/56; H01L 23/538; H01L 21/48
See application file for complete search history.

(56) References Cited

U.S. PATENT DOCUMENTS

2014/0110841 A1    4/2014  Beer et al.

*Primary Examiner* — Elias M Ullah
(74) *Attorney, Agent, or Firm* — Mintz Levin Cohn Ferris Glovsky and Popeo, P.C.; Peter F. Corless; Steven M. Jensen

(57) ABSTRACT

A semiconductor package structure and a method of fabricating the same are provided. The semiconductor package structure includes a package body having opposing first and second surfaces; a plurality of first conductive pads and a plurality of second conductive pads formed on the first surface of the package body; a semiconductor component embedded in the package body and electrically connected to the first conductive pads; and a plurality of conductive elements embedded in the package body, each of the conductive elements having a first end electrically connected to a corresponding one of the second conductive pads and a second end opposing the first end and exposed from the second surface of the package body. Since the semiconductor component is embedded in the package body, the thickness of the semiconductor package structure is reduced.

20 Claims, 7 Drawing Sheets

METHOD OF FABRICATING SEMICONDUCTOR PACKAGE STRUCTURE

CROSS-REFERENCE TO RELATED APPLICATIONS

This application is a divisional of application U.S. Ser. No. 14/708,249, filed on May 10, 2015, which claims under 35 U.S.C. § 119(a) the benefit of Taiwanese Application No. 103132037, filed Sep. 17, 2014, the entire contents of which are incorporated herein by reference.

BACKGROUND OF THE INVENTION

1. Field of the Invention

The present invention relates to semiconductor package structures and methods of fabricating the same, and, more particularly, to a semiconductor package structure and a method of fabricating the same, without the use of a rigid board.

2. Description of the Prior Art

With the booming of electronic industries, many electronic products tend to be developed to be highly integrated and easy to carry. With the evolution of package techniques, the package techniques of chip present in high variety. In addition, the size and dimension of semiconductor package tend to be smaller to achieve the purpose of making the semiconductor package member in a compact size.

FIG. 1 is a conventional semiconductor package structure 1. The semiconductor package structure 1 comprises a rigid board 10, a plurality of solder balls 11, a chip 12, a cover layer 13, a dielectric layer 14, a circuit layer 15, a solder-resist layer 16, and an electronic device 17.

The rigid board 10 has opposing top and bottom surfaces 10a and 10b. The chip 12 is disposed on the top surface 10a of the rigid board 10 with an non-active surface of the chip 12.

The cover layer 13 is formed on the top surface 10a of the rigid board 10, and covers the solder balls 11 and the chip 12, with the solder balls 11 and an active surfaces of the chip 12 exposed. The dielectric layer 14 is formed on the cover layer 13 and has a plurality of vias to expose the solder balls 11 and electrode pads of the chip 12.

The circuit layer 15 is formed on the dielectric layer 14 and electrically connected to the solder ball 11 and the electrode pads of the chip 12. The solder-resist layer 16 is formed on the dielectric layer 14 and the circuit layer 15. A portion of the circuit layer 15 is exposed from the solder-resist layer 16, for electrical connection for the electronic device 17 to be provided thereon.

However, the disadvantage of the semiconductor package structure 1 is that disposing the chip 12 covered by the cover layer 13 on the rigid board 10 will result in an increase in thickness of the semiconductor package structure 1, and further causes the dimension of the semiconductor package structure 1 to have undesired size or dimension and will be hard to achieve the purpose of the highly integrated design.

Therefore, how to overcome the above conventional technical problem and reduce the overall thickness of the semiconductor package structure is an urgent need.

SUMMARY OF THE INVENTION

According to the above disadvantages of the conventional techniques, the present invention provides a semiconductor package structure, comprising: a package body comprising opposing first and second surfaces; a plurality of first conductive pads and a plurality of second conductive pads formed on the first surface of the package body; a semiconductor component embedded in the package body and electrically connected to the first conductive pads; and a plurality of conductive elements embedded in the package body, each of the conductive elements having a first end electrically connected to a corresponding one of the second conductive pads and a second end opposing the first end and exposed from the second surface of the package body.

The present invention provides a method of fabricating a semiconductor package structure: comprising: providing a release member that has opposing top and bottom surfaces; forming a plurality of first conductive pads and a plurality of the second conductive pads on the top surface of the release member; disposing a semiconductor component on the first conductive pads and electrically connecting the semiconductor component to the first conductive pads, forming a plurality of conductive elements on the second conductive pads, each of the conductive elements having opposing first and second ends, and forming on the top surface of the release member a package body having opposing first and second surfaces and encapsulating the semiconductor component and the conductive elements, with the first and second conductive pads exposed from the first surface of the package body, and the second ends of the conductive elements exposed from the second surface of the package body; and removing the release member.

The present invention provides a method of fabricating a semiconductor package structure: comprising: providing a release member having opposing top and bottom surfaces; forming a patterned first dielectric layer, from which a portion of the top surface of the release member is exposed; forming a plurality of first conductive pads and a plurality of second conductive pads on the exposed portion of the top surface of the release member; disposing a semiconductor component on the first conductive pads and electrically connecting the semiconductor component to the first conductive pads, forming a plurality of conductive elements on the second conductive pads, each of the conductive elements having opposing first and second ends, and forming on the first dielectric layer a second dielectric layer, in which the conductive elements and the semiconductor component are embedded, the first and second dielectric layers forming a package body that has a first surface coupled to the first dielectric layer and a second surface coupled to the second dielectric layer; and removing the release member.

In an embodiment, the conductive elements and the second dielectric layer are formed by: forming the second dielectric layer on the first dielectric layer; forming a plurality of through holes penetrating the second dielectric layer, with the second conductive pads being exposed; and forming the conductive elements in the through holes.

In an embodiment, the conductive elements and the second dielectric layer are formed by: forming the conductive elements on the second conductive pads; and forming on the first dielectric layer the second dielectric layer that encapsulates the conductive elements.

In an embodiment, a portion in thickness of the second dielectric layer is removed, to expose the second ends of the conductive elements from the second surface of the package body.

In an embodiment, after the package body is formed, an insulating layer is formed on the second surface of the package body, the insulating layer having a plurality of first openings, from which the second ends of the conductive elements are exposed; and a plurality of solder pads are disposed on the conductive pads. In an embodiment, each of the solder pads has a conductive layer formed on the second end of a corresponding one of the conductive elements and a metal layer formed on the conductive layer. In another embodiment, after the solder pads are formed, a surface finish layer is formed on exposed surfaces of the solder pads, the first conductive pads, and the second conductive pads. In an embodiment, the semiconductor package structure further comprises: an insulating layer formed on the second surface of the package body and having a plurality of first openings, from which the second ends of the conductive elements are exposed; and solder pads formed on the second ends of the conductive elements. In an embodiment, each of the solder pads has a conductive layer formed on the second end of a corresponding one of the conductive elements and a metal layer formed on the conductive layer. In another embodiment, a surface finish layer is further formed on exposed surfaces of the solder pads, the first conductive pads, and the second conductive pads.

In an embodiment, after the release member is removed, a stack member is further disposed on the first surface of the package body, and the stack member is electrically connected to the first conductive pads and the second conductive pads. In an embodiment, the stack member is disposed by: disposing an electronic component on the first surface of the package body, and electrically connecting the electronic component to the first conductive pads and the second conductive pads; and forming an encapsulant on the first surface of the package body, for encapsulating the electronic component.

In an embodiment, the electronic component is a substrate, a semiconductor chip, an interposer, or a packaged or unpackaged semiconductor component.

In an embodiment, the conductive elements are solder balls or metal pillars.

In an embodiment, the semiconductor component is an active component or a passive component.

Since the semiconductor component is embedded in the dielectric layer, the thickness of the semiconductor package structure is desirably reduced.

In an embodiment, a photosensitive dielectric material is applied for forming the package body, and the photosensitive dielectric material is photo-resistant and can be used for insulating package. Therefore, in the process of forming the package body there is no need of the use of photoresist, thereby simplifying the process.

DETAILED DESCRIPTION OF THE PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

It should be understood, in this specification to the accompanying drawings depicted structure, proportion, size, etc., are disclosed only to match the content of the specification, to facilitate the understanding and reading of those skilled in the art, but not intend to limit the present invention in specific conditions, and technically do not have substantial meaning. Any modification of the structure, change of the ratio relation, or adjustment of the size should be involved in the scope of disclosures in this specification without influencing the producible efficacy and the achievable objective of this specification. Also, in this specification, the referred terms such as "upper", "top", "bottom", "first", "second", etc., are only for the convenience to describe, not for limiting the scope of embodiment in this invention. Those changes or adjustments of relative relationship without substantial change of technical content should also be considered within the category of implementation.

First Embodiment

Refer to FIGS. 2A-2H, which illustrate a method of fabricating a semiconductor package structure according to the present invention.

Figure 1:
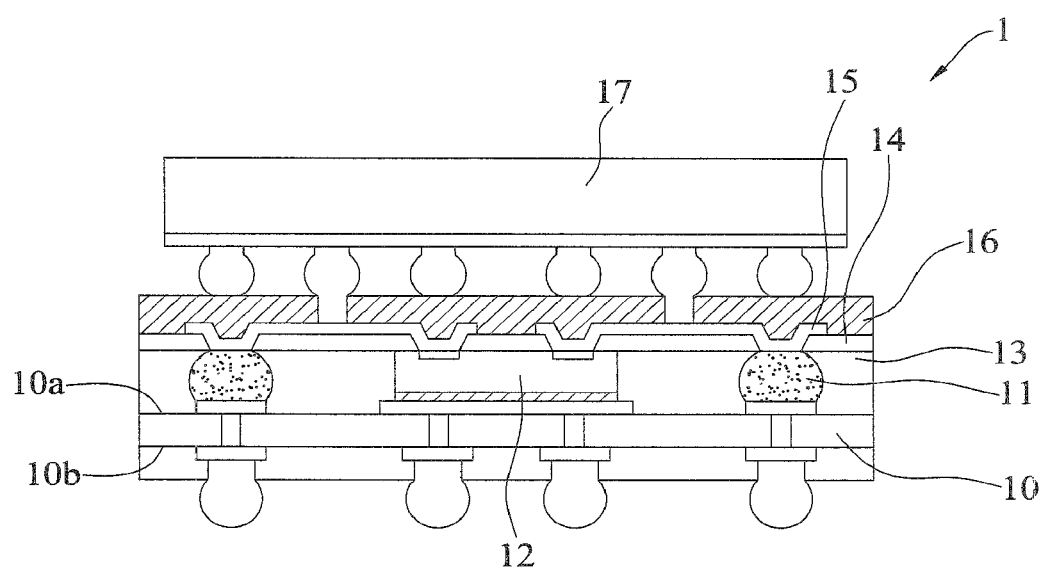
FIG. 1 is a cross-sectional view of a conventional semiconductor package structure.
Figure 2A:
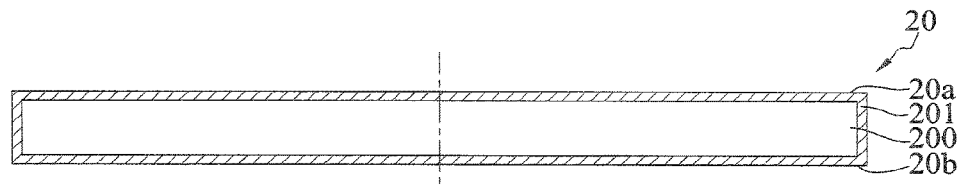
FIGS. 2A-2H illustrate a method of fabricating a semiconductor package structure according to the present invention, wherein FIG. 2A' is another aspect of an embodiment of FIG. 2A, FIG. 2B' is another aspect of FIG. 2B, and FIG. 2D' is another aspect of FIG. 2D.
Figure 2A:
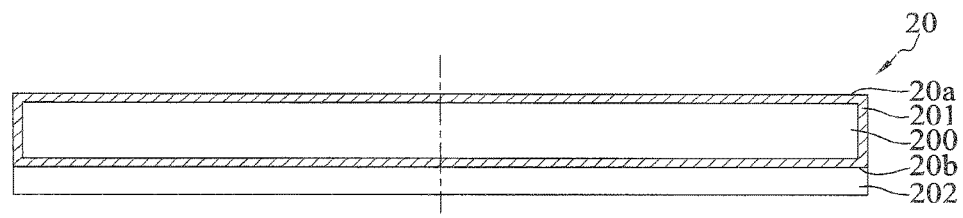

As shown in FIG. 2A, a release member 20 having opposing top and bottom surfaces 20a and 20b is provided.

In an embodiment, the release member 20 is made of a metal composite material formed of iron 200 having a surface covered with a metal material 201. In an embodiment, there is no specific limitation for selection of the metal material, but the metal material should be capable of being etched.

In an embodiment, an insulating layer 202 is further formed on the bottom surface 20b of the release member 20, as shown in 2A'. In an embodiment, there is no specific limitation for the material of the insulating layer 202. The insulating layer 202 can be an insulating low profile polymer colloid such as polyimide, epoxy, and so on. In an embodiment, the insulating layer 202 is made of polyimide.

Figure 2B:
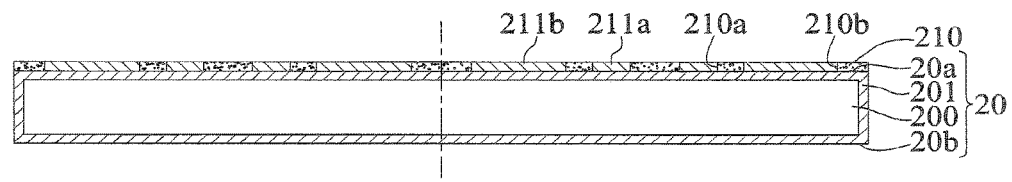
Figure 2B:
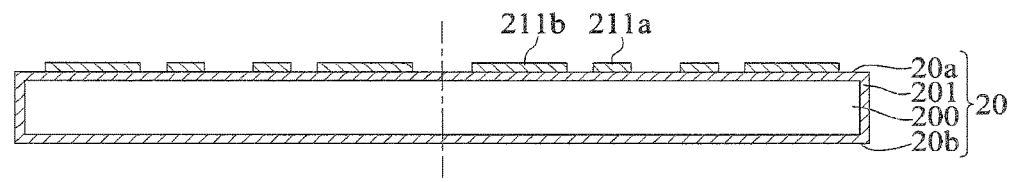

As shown in FIG. 2B, a patterned first dielectric layer 210 is formed on the top surface 20a of the release member 20, with a portion of the top surface 20a of the release member 20 being exposed from the first dielectric member, and a plurality of first conductive pads 211a and a plurality of second conductive pads 211b are formed on the exposed portion of the top surface 20a of the release member 20.

In an embodiment, the first conductive pads 211a and the second conductive pads 21b are patterned circuits.

In an embodiment, the patterned first dielectric layer 210 has a plurality of first openings 210a and a plurality of second openings 210b, and a conductive material is filled into the first openings 210a and the second openings 210b to form the first conductive pads 211a and the second conductive pads 211b, respectively.

In an embodiment, the first dielectric layer 210 is formed of a photosensitive dielectric material, and the first openings 210a and the second openings 210b are formed on the first dielectric layer 210 by lithography. When the first dielectric layer 210 is made of the photosensitive dielectric material, because of the photo-resistant and insulating package properties of the photosensitive dielectric material, it is unnecessary to remove the first dielectric layer 210 to form the first conductive pads 211a and the second conductive pads 211b, and can be directly used for insulating packaging.

In another embodiment, the first conductive pads 211a and the second conductive pads 211b are formed on the top surface 20a of the release member 20 in advance, as shown in FIG. 2B'.

In an embodiment, a semiconductor component, a second dielectric layer and a plurality of conductive elements are formed subsequently.

Figure 2C:
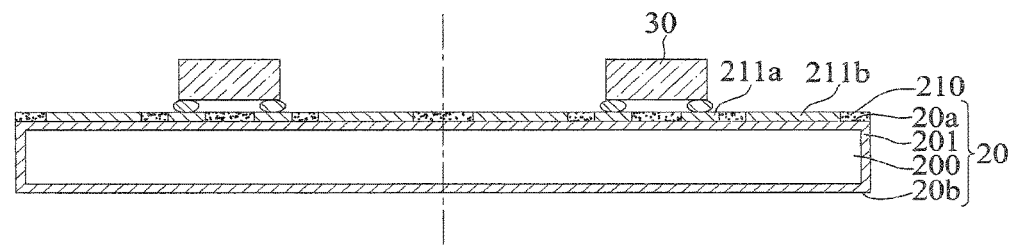

As shown in FIG. 2C, a semiconductor component 30 is disposed on and electrically connected to the first conductive pads 211a.

In an embodiment, the semiconductor component 30 is, but is not limited to an active component or a passive component.

Figure 2D:
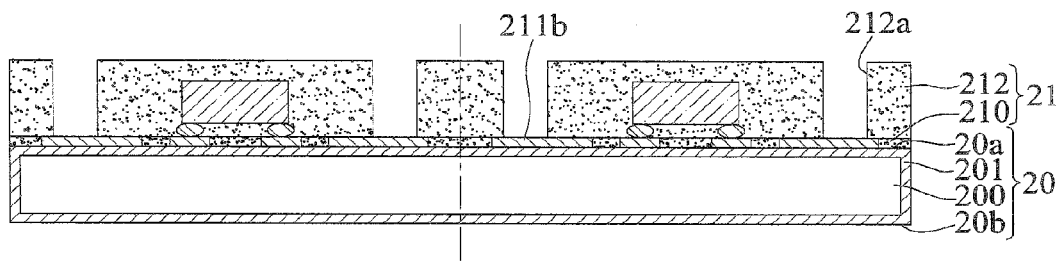
Figure 2D:
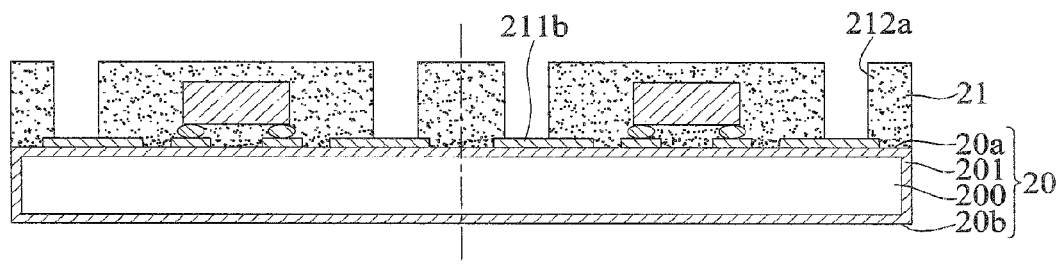

As shown in FIG. 2D, the second dielectric layer 212 is formed on the top surface 20a of the release member 20, and the semiconductor component 30 is embedded in the second dielectric layer 212.

In an embodiment, after the second dielectric layer 212 is formed, a plurality of the through holes 212a are further formed. The through holes 212a penetrate the second dielectric layer 212, with the second conductive pads 211b being exposed.

In an embodiment, as shown in FIG. 2B', the semiconductor component 30 is disposed on and electrically connected to the first conductive pads 211a, and an package body 21 is formed on the top surface 20a of the release member 20, with the semiconductor component 30 being embedded in the package body 21, as shown in FIG. 2D'. In an embodiment, the package body 21 is formed of a molding compound or a prepreg by moulding or laminating technique. Then, the through holes 212a penetrating the package body 21 are formed in the package body 21.

Figure 2E:
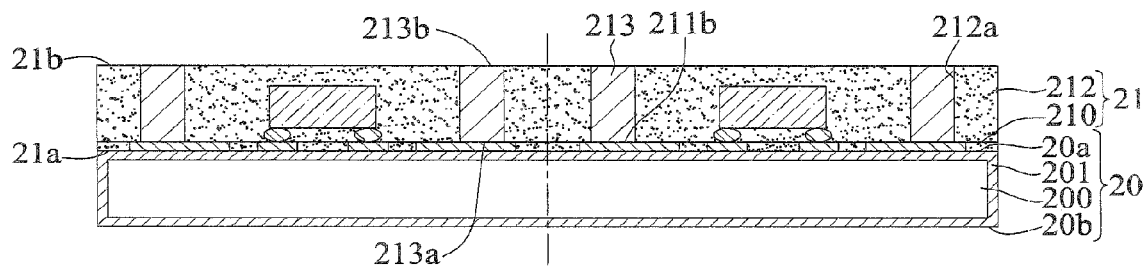

In an embodiment, there is no specific limitation to the method of forming the through holes 212a. It can be achieved by laser drilling or machine drilling technique. In an embodiment, because of the material of the second dielectric layer 212 according to the present invention is a photosensitive dielectric material, the photosensitive dielectric material not only is electric insulating but also photo-resistant. Therefore, the through holes 212a of the second dielectric layer 212 can be formed by a patterning method such as exposure and development. The first dielectric layer 210 and the second dielectric layer 212b constitute the package body 21. As shown in FIG. 2E, a conductive material is filled into the through holes 212a to form the conductive elements 213, each of which has a second end 213b and a first end 213a that is in contact with a corresponding one of the second conductive pads 211b.

In an embodiment, the conductive material is metal and is formed in the through holes 212a by electroplating.

Figure 2F:
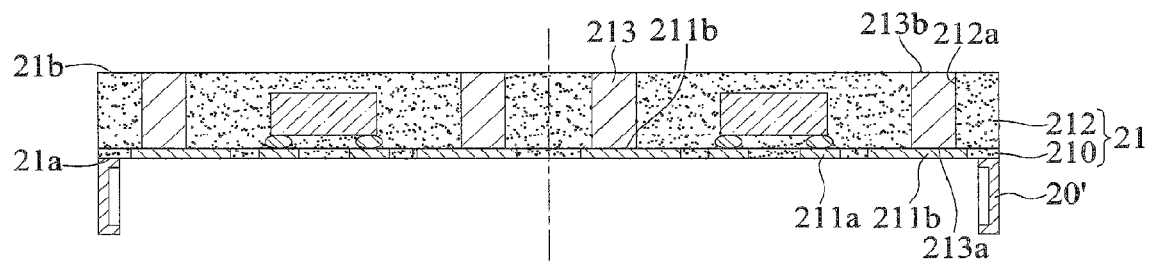

As shown in FIG. 2F, the release member 20 is removed to expose the first surface 21a of the package body 21 composed of the first dielectric layer 210 and the second dielectric layer 212. The second ends 213b of the conductive elements 213 are exposed from the second surface 21b of the package body 21, and the first conductive pads 211a and the second conductive pads 211b are exposed from the first surface 21a of the package body 21.

In an embodiment, the release member 20 is not removed entirely, but has a portion 20' remained to serve as a support member in the following process, so as to keep the overall flatness of the package body 21.

If the release member 20 on which the electric insulating layer 202 is formed is employed, as shown in FIG. 2A', the insulating layer 202 can be removed before the release member 20 is removed.

Figure 2G:
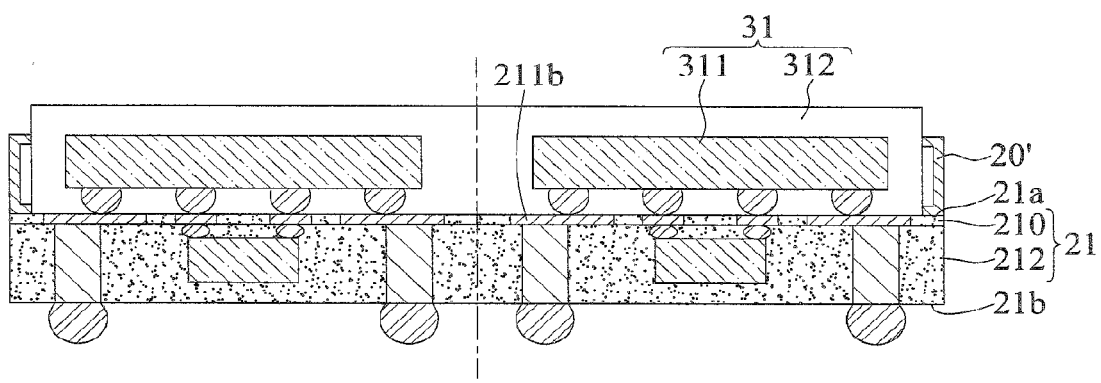

As shown in FIG. 2G, the structure of FIG. 2F is flipped, and a stack member 31 is disposed on the first surface 21a of the package body 21, and electrically connected to the first conductive pads 211a and the second conductive pads 211b.

In an embodiment, the stack member 31 comprises an electronic component 311 disposed on the first surface 21a of the package body 21 and electrically connected to the first conductive pads 211a and the second conductive pads 211b; and an encapsulant 312 formed on the first surface 21a of the package body 21, for encapsulating the electronic component 311. In an embodiment, the electronic component 311 can be, but is not limited to, a substrate, a semiconductor chip, a wafer, or a packaged or unpackaged semiconductor component.

In an embodiment, the rigid support of the following process is further provided by the portion of the release member 20'.

Figure 2H:
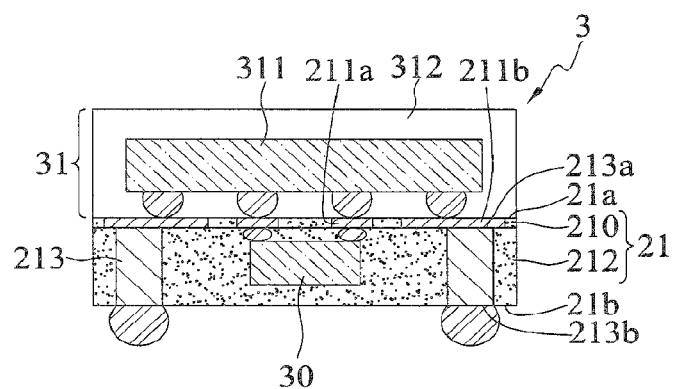

As shown in FIG. 2H, a singulation process is performed to produce a plurality of the semiconductor package structures 3.

Each of the semiconductor package structures 3 according to the present invention comprises: a package body 21 having opposing first and second surfaces 21a and 21b; a plurality of first conductive pads 211a and a plurality of second conductive pads 211b formed on the first surface 21a of the package body 21; a semiconductor component 30 embedded in the package body 21 and electrically connected to the first conductive pads 211a; and a plurality of the conductive elements 213 embedded in the package body 21 and electrically connected to the second conductive pads 211b, wherein each of the conductive element 213 has a first end 213a electrically connected to a corresponding one of the second conductive pads 211b and a second end 213b that is exposed form the second surface 21b of the package body 21.

In an embodiment, the semiconductor package structure 3 further comprises a stack member 31 disposed on the first surface 21a of the package body 21 and electrically connected to the first conductive pads 211a and the second conductive pads 211b.

In an embodiment, the stack member 31 has: an electronic component 311 disposed on the first surface 21a of the package body 21 and electrically connected to the first conductive pads 211a and the second conductive pads 211b; and an encapsulant 312 formed on the first surface 21a of the package body 21, for encapsulating the electronic component 311. In an embodiment, the electronic component 311 is a semiconductor chip, or a packaged or unpackaged semiconductor component.

In an embodiment, the package body 21 is composed of a first dielectric layer 210 with a surface thereof corresponding to the first surface 21a of the package body 21 and a second dielectric layer 212 with a surface corresponding to the second surface 21b of the package body 21. The semiconductor component 30 is embedded in the second dielectric layer 212, and the first conductive pads 211a and the second conductive pads 211b are exposed from the first surface 21a of the package body 21. The second ends 213b of the conductive elements 213 are exposed from the second surface 21b of the package 21.

Second Embodiment

The second embodiment differs from the first embodiment in that in the second embodiment the conductive elements (such as solder balls or metal pillars) are formed on the second conductive pads first, and then the second dielectric layer is formed.

FIGS. 3A-3G' illustrate another method of fabricating a semiconductor package structure according to the present invention.

Figure 3A:
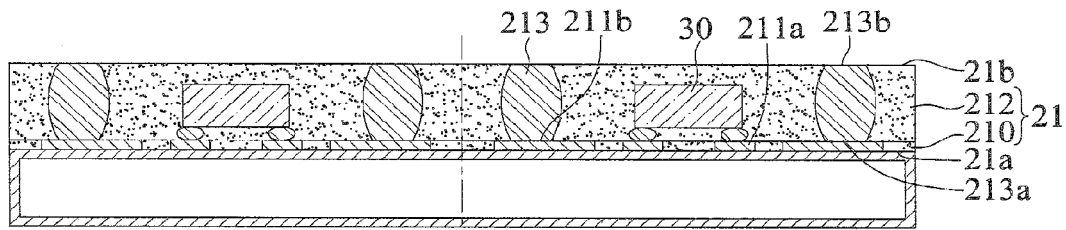
FIGS. 3A and 3G illustrate another method of fabricating a semiconductor package structure according to the present invention, wherein FIG. 3A' is another aspect of FIG. 3A, and FIG. 3G' is another aspect of FIG. 3G.
Figure 3A:
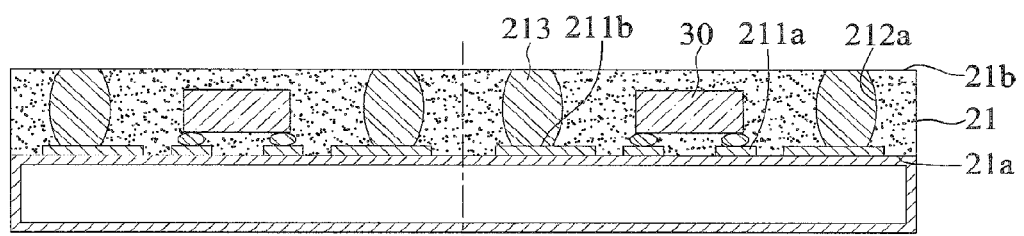

As shown in FIG. 3A, the conductive elements 213 are formed on the second conductive pads 211b, each of the conductive elements 213 having a second end 213b and a first end 213a that opposes the second end 213b and is electrically connected to a corresponding one of the second conductive pads 211b, then the second dielectric layer 212 is formed, and a portion in thickness of the second dielectric layer 212 is removed, such that the second ends 213b of the conductive elements 213 are exposed from the second surface 21b of the package body 21 that is composed of the first dielectric layer 210 and the second dielectric layer 212.

In an embodiment, the conductive elements 213 are solder balls or metal pillars that are attached to the second conductive pads 211b, and the second dielectric layer 212 is formed of a photosensitive dielectric material.

In another embodiment, the conductive elements 213 that has the opposing first and second ends 213a and 213b are formed on the second conductive pads 211b, and then the package body 21 is formed on the top surface 20a of the release member 20 to embed the conductive elements 213 therein, as shown in FIG. 3A'. In an embodiment, the package body 21 is formed of a molding compound or a prepreg, and the package body 21 is formed by moulding or laminating technique.

Figure 3B:
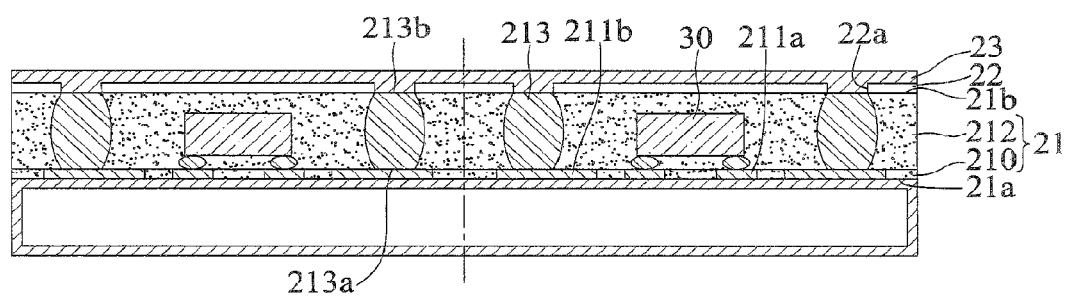

As shown in FIG. 3B, an insulating layer 22 having a plurality of openings 22a that expose the second ends 213b of the conductive elements 213 is formed on the second surface 21b of the package body 21, and a conductive layer 23 is formed on the insulating layer 22 and the second ends 213b of the conductive elements 213.

In an embodiment, the conductive layer 23 includes copper.

Figure 3C:
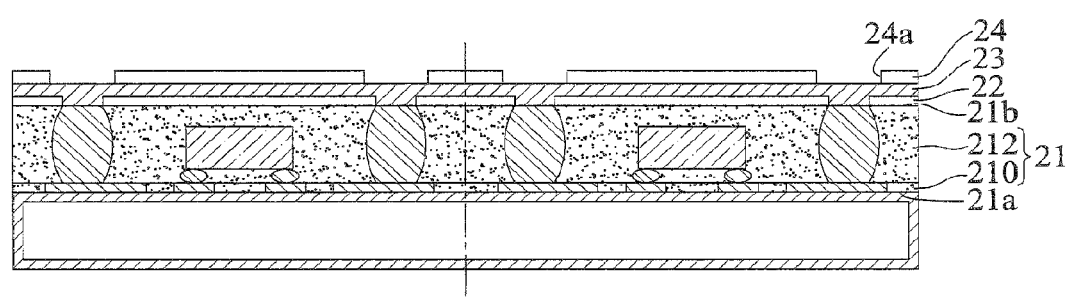

As shown in FIG. 3C, a third dielectric layer 24 is formed on the conductive layer 23. The third dielectric layer 24 has a plurality of third openings 24a that expose the conductive layer 23 corresponding to the second ends 213b of the conductive elements 213.

In an embodiment, the third dielectric layer 24 is composed of a photoresist.

Figure 3D:
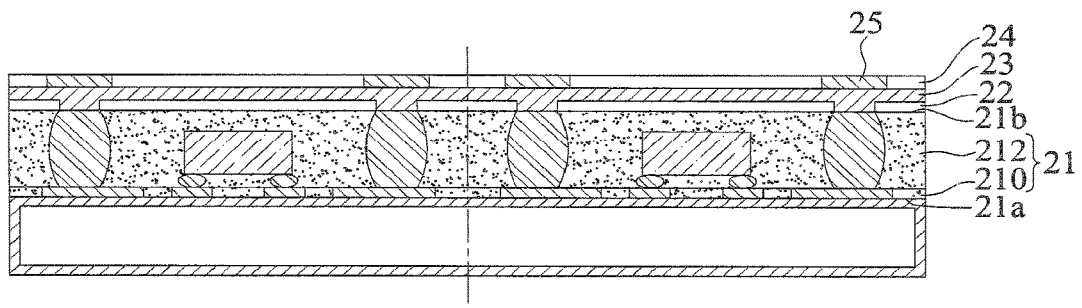

As shown in FIG. 3D, a metal layer 25 is formed in the third openings 24a of the third dielectric layer 24.

In an embodiment, the metal layer 25 is composed of copper.

Figure 3E:
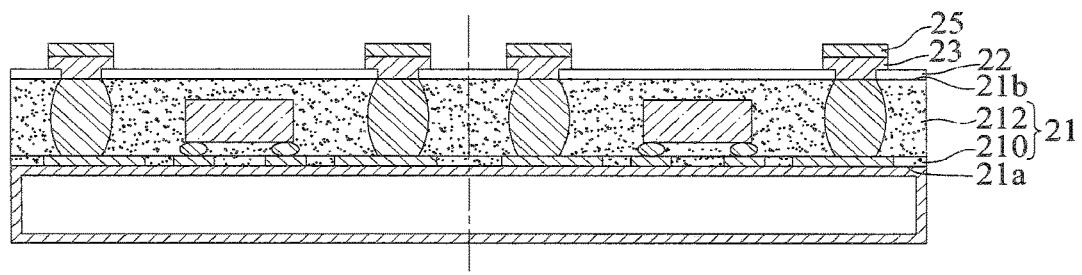

As shown in FIG. 3E, the third dielectric layer 24 and the conductive layer 23 covered by the dielectric layer 24 are removed.

In an embodiment, solder pads are composed of the conductive layer formed on the second ends of the conductive elements and the metal layer formed on the conductive layer.

Figure 3F:
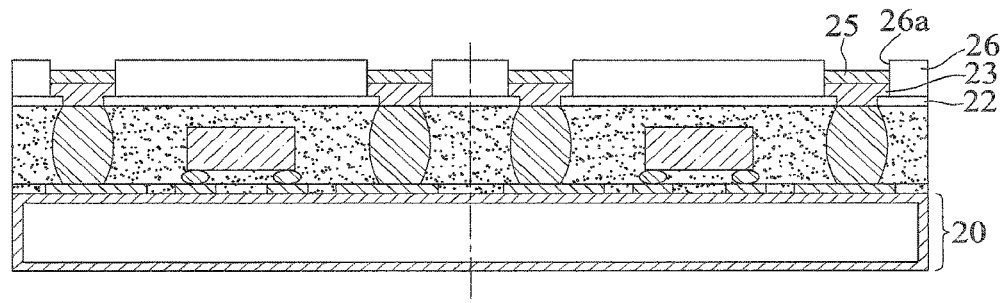

As showed in FIG. 3F, an insulating protection layer 26 such as a solder-resist layer is formed on the insulating layer 22, and has a fourth opening 26a that exposes the metal layer 25.

As shown in 3G, the release member 20 is removed to expose the first surface 21a of the package body 21, the first conductive pads 211a, and the second conductive pads 211b.

Figure 3G:
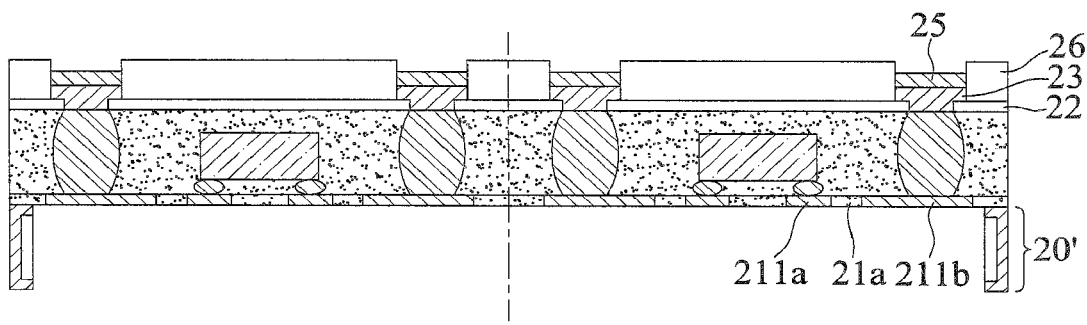
Figure 3G:
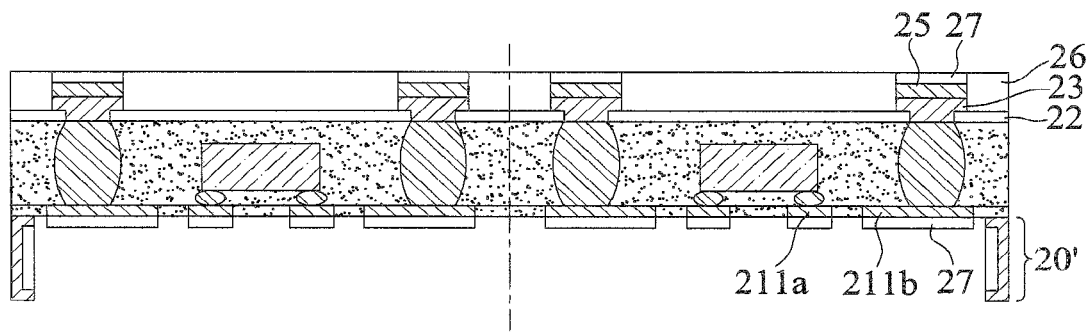

In an embodiment, a portion of the release member 20 is removed, with a portion of the release member 20' retained for providing rigid supporting in the following process. In an embodiment, a surface finish layer 27 such as organic solderability preservatives (OSP) can be formed on exposed surfaces of the metal layer 25 which constitutes the solder pads, the first conductive pads 211a and the second conductive pads 211b, as shown in FIG. 3G'.

According to the semiconductor package structure and the method of fabricating the same, as the semiconductor component is disposed in the package body without the use of the rigid board, the overall thickness of the semiconductor package structure can be decreased. Also, advantage of photo-resistant and insulation packaging by employing the photosensitive dielectric material to form the package body, the process without the use of photo-resist can be desirably simplified.

The present invention has been described using exemplary embodiments to illustrate the principles and the effects of the present invention, but not intend to limit the present invention. The present invention without departing from the spirit and scope of the premise can make various changes and modifications by a person skilled in the art. Therefore, the scope of protection of the rights of the invention, the claim should be listed in the book. Therefore, the scope of the invention should be defined by the appended claims.

What is claimed is:

1. A method of fabricating a semiconductor package structure, comprising:
   providing a release member that has opposing top and bottom surfaces;
   forming a plurality of first conductive pads and a plurality of second conductive pads on the top surface of the release member;
   disposing a semiconductor component on the first conductive pads and electrically connecting the semiconductor component to the first conductive pads, forming a plurality of conductive elements on the second conductive pads, each of the conductive elements having opposing first and second ends, and forming on the top surface of the release member a package body having opposing first and second surfaces and encapsulating the semiconductor component and the conductive elements, with the first and second conductive pads exposed from the first surface of the package body, and the second ends of the conductive elements exposed from the second surface of the package body; and
   after forming the conductive elements on the second conductive pads, removing the release member.

2. The method of claim 1, wherein the conductive elements are solder balls or metal pillars.

3. The method of claim 1, further comprising, after the package body is formed, forming on the second surface of the package body an insulating layer having a plurality of first openings, from which the second ends of the conductive elements are exposed.

4. The method of claim 1, further comprising, after the package body is formed, forming solder pads on the second ends of the conductive elements.

5. The method of claim 1, further comprising, after the release member is removed, disposing a stack member on the first surface of the package body, and electrically connecting the package member to the first conductive pads and the second conductive pads.

6. A method of fabricating a semiconductor package structure, comprising:
   providing a release member having opposing top and bottom surfaces;
   forming a patterned first dielectric layer, from which a portion of the top surface of the release member is exposed;

forming a plurality of first conductive pads and a plurality of second conductive pads on the exposed portion of the top surface of the release member;

disposing a semiconductor component on the first conductive pads and electrically connecting the semiconductor component to the first conductive pads, forming a plurality of conductive elements on the second conductive pads, each of the conductive elements having opposing first and second ends, and forming on the first dielectric layer a second dielectric layer, in which the conductive elements and the semiconductor component are embedded, the first and second dielectric layers forming a package body that has a first surface coupled to the first dielectric layer and a second surface coupled to the second dielectric layer; and after forming the conductive elements on the second conductive pads, removing the release member.

7. The method of claim 6, wherein the conductive elements and the second dielectric layer are formed by:

forming the second dielectric layer on the first dielectric layer;

forming a plurality of through holes penetrating the second dielectric layer, with the second conductive pads being exposed therefrom; and forming the conductive elements in the through holes.

8. The method of claim 7, wherein the through holes are formed by laser drilling, machine drilling, or lithography technique.

9. The method of claim 6, wherein the conductive elements and the second dielectric layer are formed by:

forming the conductive elements on the second conductive pads; and forming on the first dielectric layer the second dielectric layer that encapsulates the conductive elements.

10. The method of claim 9, further comprising, after the second dielectric layer is formed, removing a portion in thickness of the second dielectric layer, with the second ends of the conductive elements being exposed from the second surface of the package body.

11. The method of claim 6, wherein the conductive elements are solder balls or metal pillars.

12. The method of claim 6, further comprising, after the package body is formed, forming on the second surface of the package body an insulating layer having a plurality of first openings, from which the second ends of the conductive elements are exposed.

13. The method of claim 6, further comprising, after the package body is formed, forming solder pads on the second ends of the conductive elements.

14. The method of claim 13, wherein each of the solder pads comprises a conductive layer formed on the second end of a corresponding one of the conductive elements and a metal layer formed on the conductive layer.

15. The method of claim 13, further comprising, after the solder pads are formed, forming a surface finish layer on exposed surfaces of the solder pads, the first conductive pads, and the second conductive pads.

16. The method of claim 6, further comprising, after the release member is removed, disposing a stack member on the first surface of the package body, and electrically connecting the package member to the first conductive pads and the second conductive pads.

17. The method of claim 16, wherein the stack member is disposed by:

disposing an electronic component on the first surface of the package body, and electrically connecting the electronic component to the first conductive pads and the second conductive pads; and forming on the first surface of the package body an encapsulant, in which the electronic component is embedded.

18. The method of claim 16, wherein the electronic component is a substrate, a semiconductor chip, an interposer, or a packaged or unpackaged semiconductor component.

19. The method of claim 6, wherein the semiconductor component is an active component or a passive component.

20. The method of claim 6, wherein the package body is made of a molding compound, a prepreg, or a photosensitive dielectric material.

* * * * *